United States Patent [19]

Blackwood et al.

[11] 3,963,904

[45] June 15, 1976

[54] MODELING WITH A MANUALLY INTERACTIVE COMPUTER CONSTRAINT VIOLATION MONITORING MEANS

[75] Inventors: Wilfred Norman Blackwood; Finbar Joseph Gallagher, both of Dundalk; Kenneth Rutherford Richey, Bangor; William Marshall, Belfast, all of Ireland

[73] Assignee: Oeleq Limited, Dundalk, Ireland

[22] Filed: Dec. 4, 1974

[21] Appl. No.: 529,636

[30] Foreign Application Priority Data
Dec. 7, 1973  United Kingdom............... 56922/73

[52] U.S. Cl............................... 235/152; 235/150.1; 340/172.5
[51] Int. Cl.² ...................... G06F 15/06; G06G 7/48
[58] Field of Search........................ 235/152, 150.1; 340/172.5

[56] References Cited
UNITED STATES PATENTS

| | | | |
|---|---|---|---|
| 3,324,458 | 6/1967 | MacArthur | 340/172.5 |
| 3,505,512 | 4/1970 | Fricke, Jr. et al. | 235/150.1 X |
| 3,532,862 | 10/1970 | Dahlin | 235/150.1 X |
| 3,543,010 | 11/1970 | Dahlin | 235/150.1 X |
| 3,602,701 | 9/1971 | Boyd, Jr. | 235/150.1 |
| 3,770,946 | 11/1973 | Fertik et al. | 235/150.1 |
| 3,863,060 | 1/1975 | Rode et al. | 235/156 |

*Primary Examiner*—David H. Malzahn
*Attorney, Agent, or Firm*—Mason, Fenwick & Lawrence

[57] ABSTRACT

A computing system is disclosed which operates using a digital computer which is programmed with a known programme, and information is fed into the computer from an input unit which incorporates a means to apply specific values for the initial conditions of selected variables and further means which are manually actuable to vary the value of the quantity representing a designated variable from its initial condition during computation in order that the response to such variation may be monitored on a display unit which conveniently is in the form of a video display unit. Additionally monitoring means in the form of lights which are operable in response to constraint violation may be included. The manually actuable means is disclosed in a form which is purely mechanical.

5 Claims, 5 Drawing Figures

MODELING WITH A MANUALLY INTERACTIVE COMPUTER CONSTRAINT VIOLATION MONITORING MEANS

This invention relates to a computing system either of the digital or analogue or hybred type.

According to the present invention, there is provided a computing system having a computing section adapted to compute according to a predetermined programme, an input unit coupled to feed information into said computing section and a display unit coupled to said computing section to display information contained therein, and wherein said input unit includes means to apply to said computing section quantities representative of the initial conditions of variables of said information, and manually-actuable means adapted to vary the value of the quantity representing a designated variable from its initial condition.

The computing section may form part of a digital computer in which case said input unit is adapted to input said predetermined programme and to amend this programme as required by the user.

Preferably the manually actuable means is adapted to adjust a designated variable from its initial condition incrementally or decrementally in a manner which appears continuous to the user.

An embodiment of the present invention will now be described by way of example with reference to the accompanying drawings, in which:

FIG. 1 diagrammatically shows a computing system according to the present invention;

Figure 2:
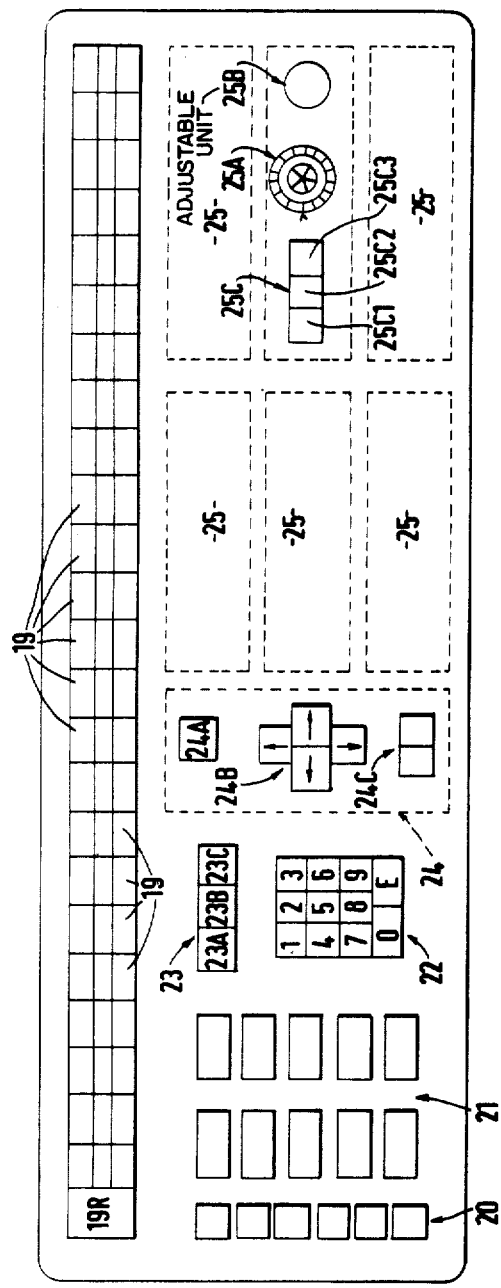
FIG. 2 shows one form of the input unit of FIG. 1.

The computing system illustrated in the drawings comprises a computing section or computer 10 which may be either analogue or digital, or a combination of both (i.e. hybred), and which is arranged to exchange information with an input unit 11. A video display unit 12 is coupled to the computer 10 and to the input unit 11 for display purposes. The video display 12 includes a cursor which may be programmed to move sequentially from position to position on the display or may be programmed for separate position control.

The input unit 11 may take one of various forms, two of which are illustrated herein. One form of the unit 11, illustrated in part in FIG. 2, comprises a plurality of switches 19, a bank of six limit lights 20, a group of display-summoning keys 21, a numeric element 22, a numeric addressing element 23, a cursor positioning device 24 for controlling the location of the position-indicating cursor of the video display unit 12 which is separate from the unit 11, and a group of six manually-actuable means 25 which may be used in a manner to be described to vary the value of a designated variable of a problem undergoing solution within the computer 10 when loaded with a predetermined programme. The unit 11 also includes an 'alpha' section (not shown) incorporating an alphabetical keyboard and means for accepting a predetermined computer programme and for loading that programme into the computer 10. The programme is tailored to respond to designated signals from respective ones of the keys 21 to output a dedicated subprogramme for display on the unit 12 and likewise the limit lights 20 are responsive to the occurrence of predetermined conditions within the programme and in this sense act as a monitoring means for the problem under computation.

In a specific example, the computer programme is one which assesses financial condition or performance of a company or other concern. Briefly, the programme, which is known per se, is such as to provide a dynamic model of the financial condition or performance of the concern under investigation at the end of successive intervals of simulated time and consequently the information computed by the computer 10 is displayed on the display unit 12 in an accepted accountancy presentation, namely, Balance Sheets, Profit & Loss Accounts, Sales Figures, Purchase Figures, credit ratios, Loan capital, Interest charges, credit terms and the like as determined by respective ones of the keys 21. Reference may be had to British Patent Specification No. 1,355,511 which describes this problem in detail and which illustrates one form of accepted accountancy presentation. Thus, in FIG. 2, the keys 21 each provide for a particular predetermined format to be displayed on the display unit 12. For example, the format could be a Balance Sheet with suitable headings, the numerical data being determined as described hereinafter.

The switches 19, which conveniently may be twenty-four in number select the simulated time period over which the computer 10 is to operate to provide the financial standing depicted on the display unit 12, and require to be manually set. If a single switch 19 is depressed to the 'ON' position the computer 10 calculates the financial standing or performance of the company at the end of that period. If two switches 19 are depressed to the ON position the computer 10 will calculate the financial performance of the company at the end of the period denoted by the switch 19 which is furthest to the right taken from the standing of the company at the time denoted by the switch 19 which is furthest to the left. The switches 19 may be cancelled at any time by use of a 'reset' switch 19R. Conveniently the switches 19 are of the paddle action type with an 'ON' position and a 'LOCKED ON' position on opposite sides of the centre or 'OFF' position. This permits selected switches 19 to be locked on for reference purposes. The reset switch 19R only cancels switches in the 'ON' position.

The numerical addressing element 23 in combination with the numeric element 22 and the cursor positioning element 24 is programmed to call up values of the problem variables at an identifiable location on the displayed format from information contained in stores within the computer 10. The element 23 contains three keys 23A, 23B, 23C respectively labelled 'Line', 'Period', 'Initial' and the programme is arranged to respond to operation of the 'Line' key 23A followed by a numerical combination from the element 22 to permit the operator to gain access to information stored within the computer 10 concerning the particular production line which is dedicated to the specific numerical combination utilised. Operation of the 'Period' key 23B followed by a numerical combination from the element 22 permits the operator to select information stored within the computer 10 concerning a particular time period for the previously selected production line. If period code zero is used the displayed format is displayed without numerical data. Subsequent operation of the 'Initial' key 23C followed by location of the video display cursor at a particular address allows a particular numerical combination from the element 22 to be entered into the particular address as the specific initial condition or value representative of the variable concerned. Information already entered on the display may be changed by locating the cursor beneath the existing data in the desired location, the new numerical data is dialled into the element 22 and entered into the display and hence into the appropriate store of the computer 10 by use of the 'E' key of the element 22. The cursor of the video display unit 12 is moved from its 'home' position and positioned below the value to be altered, using the device 24, which has a key 24A to move the cursor direct to its 'home' position, other keys 24B to index the cursor in any direction from a previous position, and other keys 24C to move the cursor rapidly either up or down the page of visual display.

The limit lights 20 which for example could represent Minimum Current Ratio, Minimum Profit to Capital Ratio; Maximum Creditors to Debtors Ratio; Minimum Profit to Sales Ratio; Minimum Stock; and Maximum Overdraft are operated by the computer 10 when respective ones of these constraints have been violated in achieving the displayed financial standing of the company. Predetermined settings of these constraints are entered into stores of the computer 10 by the initial programme and these settings may be varied by utilising the 'alpha' section of the unit 11 to gain access to the appropriate stored information and thereafter utilising the numeric element 22 and the cursor positioning device 24.

Figure 3:
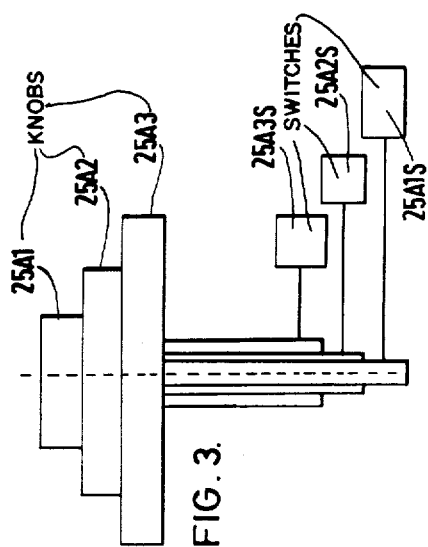
FIGS. 3 and 4 illustrate different forms of the manually-actuable element of FIG. 2.
Figure 1:
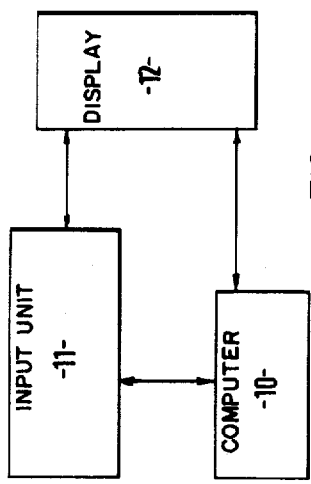

The manually-actuable means 25 of the present invention in this embodiment, comprise three separate elements, an addressing unit 25A, an adjustment unit 25B and a control unit 25C. The purpose of this means 25 is to enable the operator to adjust or 'tune' values of variables from their initial condition, while at the same time visually monitoring the effect on the computation on the video display unit 12 and also by means of the lights 20. The addressing unit 25A is preferably a triple concentric switch as illustrated in FIG. 3 although it could alternatively be in the form of three push-button numeric elements operating magnetic switches. In FIG. 3 the smallest knob 25A1 is arranged to actuate a set of switches 25A1S which direct signals to the computer 10 and which are received by the computer 10 in accordance with the predetermined programme as designating the various activities of the company (such as 'sales', 'purchases', and the like). The knob 25A2 is arranged to actuate a further set of switches 25A2S which direct signals to the computer 10 and which the computer 10 receives in accordance with the predetermined programme as designating the various product lines of the company. The largest knob 25A3 is arranged to actuate a still further set of switches 25A3S which direct signals to the computer 10 and which the computer 10 receives in accordance with the predetermined programme as designating the various time periods over which the computer can operate. Having dialled a particular address on the unit 25A to gain access to the value of a specific variable in a specific period of simulated time in respect of a particular product line the operator can vary the value of that variable incrementally or decrementally from its value pre-set by the elements 22 and 23 described above by use of the unit 25B in combination with the unit 25C. The unit 25B may consist of a simple potentiometer wound linearly or logarithmically having a constant applied voltage so that the output from the unit 25B is dependent upon the angular movement of the knob. The unit 25C incorporates three separate keys; 25C1 which acts as a 'scan' control to cause the computer 10 temporarily to accept the value of the designated variable dictated by the unit 25B and to compute the financial position or performance of the company therefrom; 25C2 which when actuated subsequent to the key 25C1 causes the altered value of the designated variable to be permanently entered in substitution for that previously held in the store of the computer 10; and 25C3 which when operated as an alternative to key 25C2 causes the computer 10 to revert back to the previously stored value of the designated variable.

Figure 4:
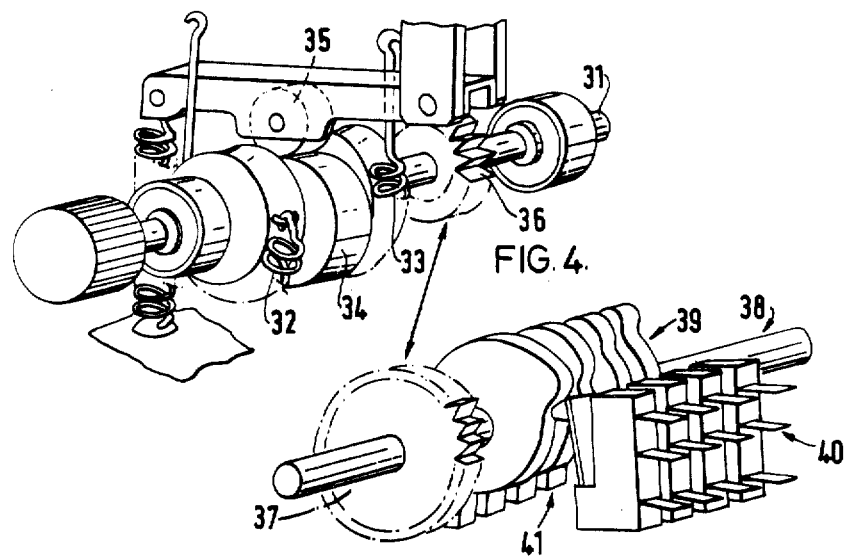

Although the unit 25B may consist of a simple potentiometer it is preferred to utilise a centre-sprung switching element, i.e. one which is resiliently biassed in opposite directions towards a centre or out of use position and that the signal output be digital in nature. The preferred form of the unit 25B is shown in FIG. 4 and comprises an operating knob 30 mounted on the end of a first shaft 31 which is resiliently biassed into a predetermined position by means of oppositely arranged coil springs 32,33 and a cam member 34 having a resiliently biassed follower member 35. The shaft 31 carries a gear wheel 36 which intermeshes with a gear wheel 37 carried by a second shaft 38 which shaft also carries a plurality of switch actuating cams 39 capable of operating microswitches arranged in two groups 40 and 41. The making of the microswitches in succession enables successive frequency multiples of a reference frequency pulse to be transmitted to a counter which causes variation of the value of the designated variable in the computer 10. The reference frequency is provided by a clock generator (not shown) with frequency divider as is conventional. Conveniently when the first microswitch in either group is closed one pulse per second is transmitted to the counter which causes an increase or decrease to occur in the designated initial condition depending upon which microswitch is closed. Thus, say a figure of 15,000 would increase (or decrease) by one unit per second and the computer 10 would continuously update its computed result in accordance with the updated value of the variable.

Further positional adjustment of the knob 30 would cause a second microswitch to make thereby increasing (or decreasing) the output from one pulse per second to say three pulses per second in order that a desired computed result might be reached more quickly. Movement of the knob 30 in the opposite rotational direction would produce a decrease (or increase) in the value of the variable at a predetermined rate. The number of rates available may be chosen as considered convenient and as shown in FIG. 4 four positive rates are provided by four microswitches in the embodiment and a like number of negative rates. In each case the variation of the designated variable appears continuous to the user.

Figure 5:
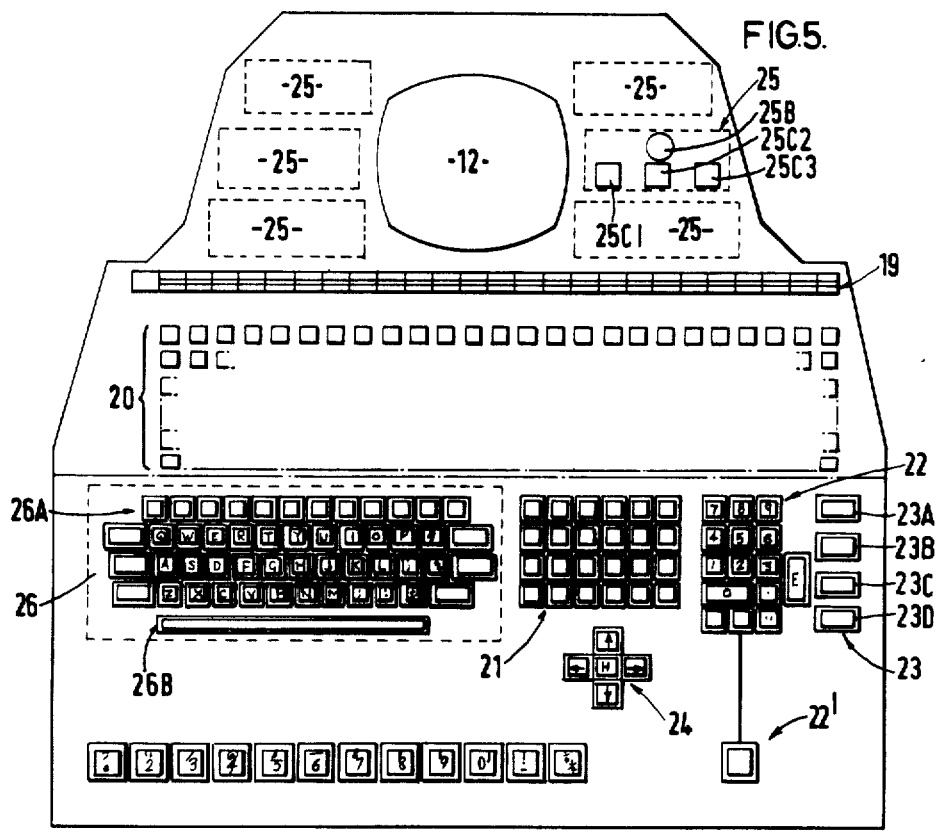
FIG. 5 shows an alternative form of the input unit of FIG. 1.

Another form which the unit 11 may take is illustrated in FIG. 5 and this unit also incorporates the switches 19, the limit lights 20, the keys 21, the numeric element 22, and the cursor positioning device 24 for controlling the location of the position-indicating cursor of the video display unit 12 which is housed in the same housing as the input unit 11. Six manually-actuable means 25 are provided adjacent the display unit 12 and an 'alpha' section 26 incorporating an alphabetic keyboard 26A and means 26B for accepting a predetermined computer programme and loading that programme into the computer 10 is centrally located in the unit 11.

The means 25 of FIG. 5 each contain the control keys 25C1, 25C2 and 25C3 and the adjustment unit 25B but addressing into the computer store is carried out on the keys of the addressing element 23 which has four keys 23A, 23B, 23C and 23D respectively operable to select a predetermined product line, a predetermined simulated time period, to reject information from further consideration or to enter information into storage within the computer 10. The element 22 includes a key 22' to provide a prefix for negative quantities.

The limit lights 20 in this embodiment are arranged in a matrix having the same number of columns as there are period setting keys 10, there being six lights 20 in each column each of which functions in a similar manner to the lights of the FIG. 2 arrangement. The lights 20 could be appropriately labelled to show, for example, the constraints with which they are associated. The labelling could be by simple adhesive tags or by means of a liquid crystal display or some other form of labelling which could be readily changed. Furthermore the lights 20 could be associated with an audible warning device and could be in the form of push keys whereby on actuation thereof a violated constraint could be disregarded during further computation.

The unit 25B of FIG. 5 is in the form previously described with reference to FIG. 4.

In the described embodiment a single video display output device has been described but it will of course be understood that a plurality of such devices could be incorporated in the display means, said devices being dedicated, for example, to display different aspects of the company's financial position or standing. Also, the input unit may comprise or utilise a video display input device. For example, a video display device arranged to accept information manually applied thereto in alpha-numeric or graphic form on the screen, this information being fed to the computing section and being operated thereon by the predetermined programme. The graphical form of information could comprise a histogram of information.

The manually-actuable means 25 in another form could comprise a foot-operated centre-sprung member arranged for heel-toe operation, in combination with an addressing unit. Thus the addressing unit would enable selection of a particular variable whilst the foot-operated member would achieve variation in the value thereof, being either upwards if toe operated or downwards if heel-operated. Alternatively, the means 25 could incorporate a joystick element which is movable in a plane defined by two mutually perpendicular directions and is centre-sprung to a central or datum position in each of said directions.

Although the programme described above relates to the financial standing of a company other programmes may operate with equal facility utilising the above-described apparatus. For example, the switches 19 might be programmed as being representative of a set of products involved in a factory scheduling problem. Activating a particular switch 19 might for example, call for a pre-set requirement for the associated product to be included in the model under computation. Alternatively the switches 19 might be used in a feed formulation problem in which case the action of a switch might represent the offering of the specification of a particular ingredient to the formulation under computation by the computer. As a further alternative the switches 19 could be used as programme select switches for accessing particular sub-routines in the programme.

By virtue of the present invention, and in particular due to the provision of the means 25 described in the embodiment, an operator of the system described is provided with a computer system which exhibits the characteristics as normally understood of an analogue computer model in that by variation of one or more designated variables the effect upon the computer model and its implications to the operator can be evaluated dynamically. Consequently, although six means 25 have been described any suitable number thereof may be accommodated.

What is claimed is:

1. A computing system having a computing section for computing according to a predetermined programme, an input unit coupled to feed information into said computing section and a display unit coupled to said computing section to display information contained therein, and wherein said input unit includes first means to apply to said computing section quantities representative of predetermined values of problem constraints, second means to apply to said computing section quantities representative of the initial conditions of variables of said information, manually-actuable third means to vary the value of the quantity representing a designated variable from its initial condition, and monitoring means having a warning element responsive to the occurrence during computation of a computed value equal to the predetermined constraint value applied by said first means, the monitoring means being effective during actuation of the manually-actuable third means to permit evaluation of the problem undergoing computation.

2. A computing system according to claim 1, wherein the manually actuable thirds means can adjust a designated variable from its initial condition incrementally or decrementally in a manner which appears continuous to the user.

3. A computing system according to claim 1 wherein said manually-actuable third means comprises switch means and a manually rotatable element arranged to operate said switch means to pass a train of pulses to vary said value.

4. A computing system according to claim 3, wherein said switch means comprise a plurality of switch elements respective ones of which are connected to pass pulse trains of different pulse rates, the switch elements being operated sequentially by said rotatable element.

5. A computing system according to claim 1, wherein said monitoring means includes warning elements in the form of a plurality of lights.

* * * * *